March 15, 1960 J. J. GODBEY 2,928,308
MEANS FOR CONTROLLING THE FREQUENCY OF A TUNING FORK
Filed March 12, 1954

ATTEST
Lloyd A. Heneveld

INVENTOR.
Josiah J. Godbey
BY Norbert E. Birch
Attorney

United States Patent Office 2,928,308

Patented Mar. 15, 1960

2,928,308

MEANS FOR CONTROLLING THE FREQUENCY OF A TUNING FORK

Josiah J. Godbey, Dallas, Tex., assignor to The Atlantic Refining Company, Philadelphia, Pa., a corporation of Pennsylvania Application March 12, 1954, Serial No. 415,895

6 Claims. (Cl. 84—409)

This invention relates to means for making final minute adjustments in the frequency of vibration of a tuning fork.

Tuning forks are widely used to control the frequency of oscillator circuits which serve to provide a standard frequency source. Each tuning fork has a natural frequency of vibration, and it is well known that this frequency may be changed by varying the loading effect on the end of the tines. For example, many forks are provided with adjustment screws threaded into the free ends of the tines, which adjustment screws may be screwed outwardly to increase the effective load on the tines and thereby decrease its frequency, or vice versa. In other cases, it has been customary to add masses of solder to the free ends of the tines to effect a lowering of the frequency of vibration of the fork after which a further fine adjustment may be made by adding or taking away from the solder masses to effect a decrease or increase, respectively, in the frequency of vibration.

In certain uses of tuning forks, namely, in the seismic recording art, it has been found that the frequency of vibration of the fork is affected by changes in pressure, and humidity. In order to minimize the effect of these variables, it is customary to hermetically seal the tuning fork in a chamber or case which thereafter is evacuated. It has also been found through experience that although the tuning fork can be adjusted before it is enclosed in its case, its frequency may change a small but appreciable amount after the case is evacuated. Accordingly, it has been the practice to try to anticipate the change in frequency due to the evacuation and make allowances therefore prior to evacuation. However, no accurate means has been devised for consistently making the correct allowance and accordingly the frequency of the fork when checked after encasement and evacuation is often found to be inaccurate. This necessitate a removal of the casing, and a second adjustment, encasement, and evacuation.

An object of this invention is to avoid this tedious hit or miss method for adjusting a tuning fork by providing a reliable and accurate means for adjusting the frequency of an encased tuning fork after the fork has been encased and the case evacuated.

Another object is to provide an exterior means for adjusting the frequency of an encased tuning fork thereby providing means for making a final accurate timing of a tuning fork mounted in a sealed case.

Another object of this invention is to provide an exterior means for adjusting the frequency of a sealed tuning fork, such means eliminating the necessity of disassembling and reassembling the unit for each adjustment.

A more specific object of this invention is to provide in combination with an encased tuning fork an exteriorly adjustable magnet which is located in proximity to the ends of the tines and which affects the vibration thereof.

Other objects and advantages will be better understood from the following description, together with the attached drawings showing preferred forms of the invention:

Figures 1, 2, 3, 4, 5, 6:
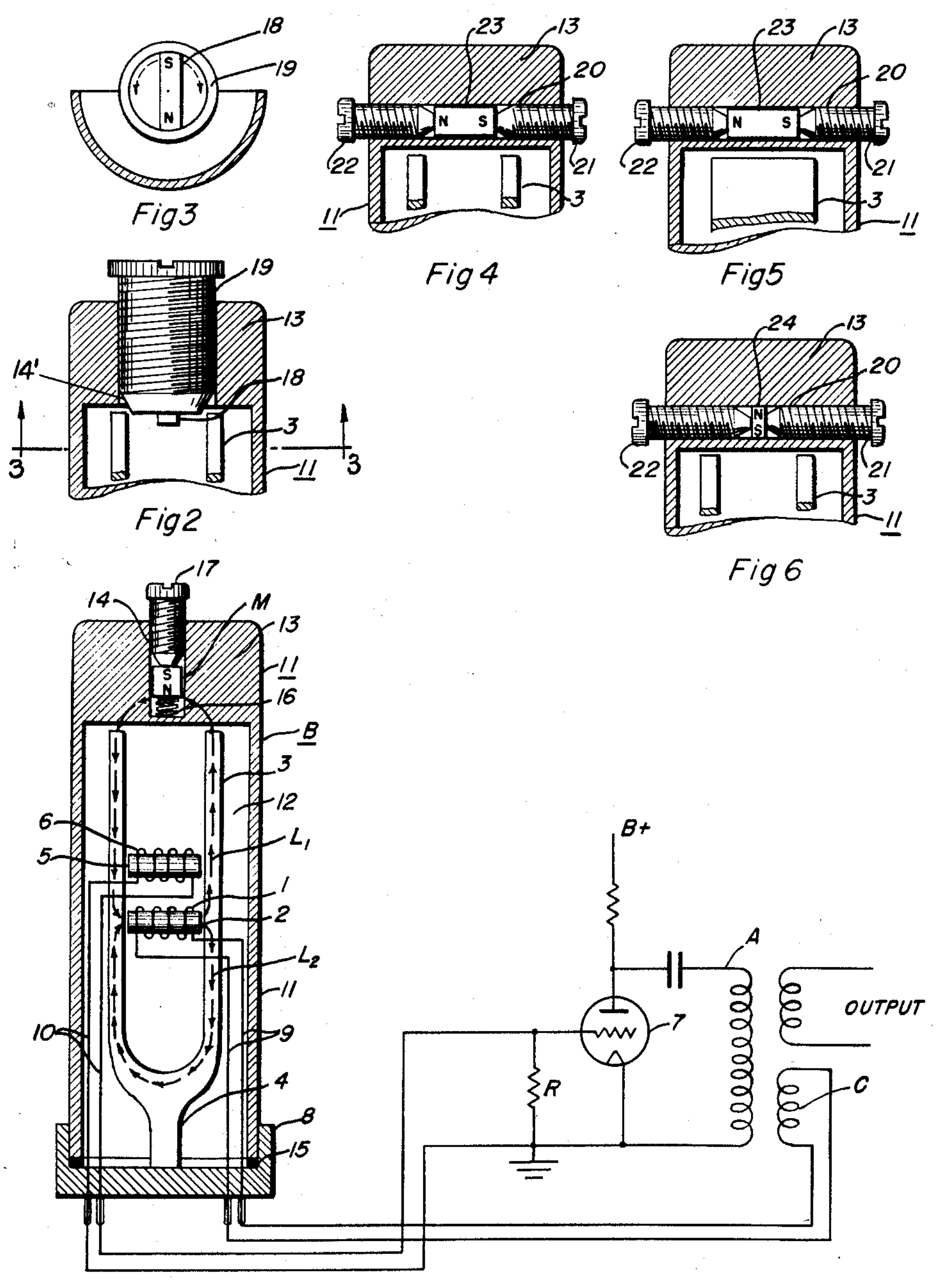
Figure 1 is a simplified circuit diagram which illustrates the functioning of a tuning fork in controlling the frequency of an oscillator and also shows a specific embodiment of the invention whereby the poles of a permanent magnet are aligned in a plane parallel to the longitudinal axis of the fork and adapted to be moved longitudinally toward or away from the fork.
Figure 2 is a modification of Figure 1 wherein the rotation of the magnet affects the frequency of the tuning fork.
Figure 3 is a cross-section of Figure 2.
Figures 4 and 5 are further modifications of Figure 1 wherein the poles of a permanent magnet are arranged and movable in a plane perpendicular to the longitudinal axis of the fork.
Figure 6 is another modification of Figure 1 wherein the poles of the magnet are aligned in a plane parallel to the longitudinal axis of the fork and adapted to be adjusted in planes perpendicular to said longitudinal axis.

In experiments with adjusting a tuning fork which was driven either electrostatically or electromagnetically to a desired frequency, I have found that a magnet placed a short distance from the ends of the tines would change the frequency of the fork. Also, any movement of the magnet will result in a change in the frequency of the vibration of the fork, it being observed that if movement of the magnet in one direction causes a decrease in frequency of vibration, movement in the opposite direction will cause an increase. This invention takes advantage of this phenomenon to effect external adjustment of the frequency vibration of an indefinite hermetically sealed tuning fork.

The instant invention can best be explained by referring to Figure 1 which illustrates a simplified circuit diagram of an oscillator whose frequency is controlled by the electromagetically driven and hermetically sealed tuning fork unit B. It will be seen that there is a driving coil 1 having a permanent magnet 2 which tends to attract and vibrate the tines 3 of the magnetic tuning fork 4 in a manner which is well known in the art. The vibrations of the tines 3 set up corresponding flux variations in the soft iron core 5 of the pickup coil 6 and the potential induced in the coil 6 is varied accordingly. This variation of potential across the resistance R drives the control grid of vacuum tube 7 and controls the frequency of the oscillator circuit.

A portion of the output which is taken off of primary coil A is fed back to the driving coil by means of the coil C in which is induced a voltage of a frequency corresponding to the frequency of vibration of the tines of the fork. Therefore, the frequency of the oscillator always corresponds to the frequency of vibration of the tuning fork and a change in the frequency of vibration of the tuning fork will correspondingly change the frequency of the oscillator.

In the embodiment shown in Figure 1 the path of the flux lines created by the permanent magnet 2 and the coil 1 is both downwardly through the righthand portion of the U-shaped tuning fork back to the magnet 2 and upwardly through one of the tines and downwardly through the other tine back to the magnet 2. This is illustrated in Figure 1 by means of the arrows $L_1$ and $L_2$, however, it should be understood that the direction of the flux lines is dependent upon the polarity of the magnet 2.

In the embodiment shown the permanent magnet M affects the tuning fork in two ways. First, since the tuning fork is made of magnetic material, the magnetic attraction of the magnet M will affect the frequency at which the fork will vibrate. Second, the magnet M disturbs the magnetic leakage $L_2$ flux which flows between the two tines and thus in that way will also affect the frequency at which the fork will vibrate.

It should be understood that the embodiment shown in Figure 1 is for purposes of illustration only. The tuning fork 4 can be driven electrostatically just as well as electromagnetically, in which case there is no magnetic leakage flux flowing between the tines 3. In this event the magnet M adjusts the frequency at which the tines vibrate by only adjusting the magnetic attraction which the magnet M has for the tines 3 of the magnetic tuning fork 4.

The instant invention involves a novel means for changing the frequency vibration of the tuning fork. Figure 1 shows a hermetically sealed tuning fork unit B comprising a tuning fork 4 having tines 3, a driving coil 1, a pickup coil 6, and the non-magnetic cover 11 having an adaptable magnet associated therewith. The tuning fork 4 is mounted on the cup-shaped base 8 which is made of insulated material. The driving coil 1 and pickup coil 6 are mounted in any conventional manner and have the leads 9 and 10, respectively, which pass through the insulated base 8. The cover 11 for the unit B has an open end which leads into the main chamber 12, and a closed end 13 having a thick wall with a smaller chamber 14 therein. This smaller chamber 14 does not communicate with the main chamber 12.

The cover 11 is mounted over the tuning fork 4 and in the cup-shaped base 8 so that the fork 4 is located in the main chamber 12. This arrangement is provided so that the closed end 13 and its chamber 14 are in proximity to the tines. The open end of the cover 11 rests inside the base 8, any conventional hermetic seal 15 being provided therebetween. Located in the chamber 14 of the cover 11 is the means for adjusting the frequency of the tuning fork.

In the embodiment shown in Figure 1 such means comprises a permanent magnet M having its poles aligned parallel to the longitudinal axis of the cover and the tuning fork. The magnet M is adjustable in the longitudinal direction by means of the spring 16 and the screw 17. Movement of the magnet M toward the tines 3 as the screw 17 advances inwardly would cause a stiffening of the tines of the fork and increase its frequency, while movement of the magnet M away from the tines under the influence of the spring 16 as the screw is screwed outwardly would cause a decrease in the frequency of the vibration of the fork.

The modification shown in Figures 2 and 3 differs from that shown in Figure 1 in that the means for adjusting the frequency in Figures 2 and 3 comprises a magnet 18 which is rotatably adjustable and the chamber 14′ extends entirely through the closed end 13. The magnet 18 is rigidly secured to the bottom of the rotatable screw type plug 19 in such a position that the poles of the magnet lie in a plane transverse to the longitudinal axis of the fork. Rotation of the plug 19 rotates the poles of the magnet 18 and brings the poles closer or further away from the tines of the fork. If the rotation brings the poles closer to the tines 3 the tines 3 stiffen thereby increasing the frequency, depending upon the polarization; in which event rotation of the poles in a direction away from the tines 3 would tend to decrease the frequency of the fork.

Figures 4, 5 and 6 differ from Figure 1 in that the magnet is arranged to be adjusted transverse to the longitudinal axis of the fork. In this case a chamber 20 is provided, such chamber running diametrically through the thick closed end 13 of the cover 11. Adjusting screws 21 and 22 threaded into opposite ends of the chamber 20 provide adjusting means for the magnet which is to be adjusted transverse to the longitudinal axis.

In Figures 4 and 5 the magnet 23 is arranged with its opposite poles transverse to the longitudinal axis of the fork and cover. In other words, the opposite poles are aligned parallel to the axis of the chamber 20. In Figure 4 the magnet 23 is adjustable in a plane which could be drawn through the tines 3 of the tuning fork 4 while in Figure 5 the magnet 23 is adjustable in a direction perpendicular to said plane.

In Figure 6 the magnet 24 is arranged with its poles aligned parallel to the longitudinal axis of the fork and cover; or in other words, transverse to the axis of the chamber 20.

In all the modifications described above the operation is as follows: Unit B is first assembled by sliding the cover 11 over the tuning fork unit so that the open end of the cover 11 fits into the cup-shaped base 8. The unit is then hermetically sealed and evacuated. Thereafter, the adjustment screws are adjusted and the frequency measured, the frequency depending upon the polarization of both the magnet located in the driving coil and the adjustable magnet and the position of the adjustable magnet in the closed end 13 of the cover 11. The adjustable magnet in the cover 11 is again adjusted by means of the adjustment screws in a direction depending on whether the frequency is to be raised or lowered. The adjustable magnet is then secured against further movement.

From the above description it is seen that this invention has eliminated the necessity of adjusting the frequency of a tuning fork by an unreliable method which very frequently requires reassembling. Instead of adjusting the frequency before assembling and evacuating the unit as has been done previously, the entire unit can be assembled and evacuated and thereafter the final adjustment made.

Furthermore, the unit according to the present invention need not be disassembled and reassembled to change the frequency of the tuning fork. On the contrary the tuning fork can be adjusted to various frequencies within a certain range with merely an exterior adjustment.

While there is shown and described several modifications of this invention, it will be appreciated by those skilled in the art that many changes can be made without departing from the scope and spirit of this invention. The adjustment of a magnet in the proximity of a fork is capable of being accomplished in many various ways. Therefore, it is understood that the invention is not limited to the above description but is to be limited only in accordance with the appended claims.

What I claim is:

1. A tuning fork frequency control device comprising the combination of a case made of nonmagnetic material and constructed in such a manner as to define a first and second chamber which are adjacent and isolated from each other, a magnetic tuning fork hermetically sealed in said first chamber, said tuning fork being mounted in one end of said first chamber and having its tines extending toward and in proximity to said second chamber, driving means for vibrating said fork, pickup means for generating an electrical signal corresponding to the vibrations of said fork, a permanent magnet mounted in said second chamber, said permanent magnet being independent from said driving means and said pickup means, and means adjustable from the exterior of said case for changing the spatial relationship of said permanent magnet with respect to the ends of said tines whereby said change in spatial relationship varies the frequency of vibration of said tuning fork mounted in said first chamber.

2. The combination defined in claim 1 wherein the permanent magnet has its poles aligned parallel to the longitudinal axis of the turning fork, and the means adjustable from the exterior of said case is adapted for shifting said magnet in a direction parallel to said longitudinal axis.

3. The combination defined in claim 1 wherein the permanent magnet has its poles aligned parallel to the longitudinal axis of the tuning fork, and the means adjustable from the exterior of said case is adapted for shifting said magnet in a direction transverse to said longitudinal axis.

4. The combination defined in claim 1 wherein the permanent magnet has its poles aligned transverse to the longitudinal axis of the tuning fork, and the means adjustable from the exterior of said case is adapted for shifting said magnet in a direction transverse to said longitudinal axis.

5. A tuning fork frequency control device comprising the combination of a case made of nonmagnetic material and constructed in such a manner as to define a first and second chamber which are adjacent and isolated from each other, a magnetic tuning fork hermetically sealed in said first chamber, said tuning fork being mounted in one end of said first chamber and having its tines extending toward and in proximity to said second chamber, driving means for vibrating said fork, pickup means for generating an electrical signal corresponding to the vibrations of said fork, a permanent magnet mounted in said second chamber, said permanent magnet being independent from said driving means and said pickup means, and means manually adjustable from the exterior of said case for changing the spatial relationship of said permanent magnet with respect to the ends of said tines whereby said change in spatial relationship varies the frequency of vibration of said tuning fork mounted in said first chamber.

6. A tuning fork frequency control device comprising the combination of a case made of nonmagnetic material and constructed in such a manner as to define a first and second chamber which are adjacent and isolated from each other, a magnetic tuning fork hermetically sealed in said first chamber, said tuning fork being mounted in one end of said first chamber and having its tines extending toward and in proximity to said second chamber, driving means hermetically sealed in said first chamber for vibrating said fork, pickup means hermetically sealed in said first chamber for generating an electrical signal corresponding to the vibrations of said fork, a permanent magnet mounted in said second chamber, said permanent magnet being independent from said driving means and said pickup means, and means adjustable from the exterior of said case for changing the spatial relationship of said permanent magnet with respect to the ends of said tines whereby said change in spatial relationship varies the frequency of vibration of said tuning fork mounted in said first chamber.

References Cited in the file of this patent

UNITED STATES PATENTS

| | | |
|---|---|---|
| 322,809 | Delany | July 21, 1885 |
| 1,653,794 | Whitehorn | Dec. 27, 1927 |
| 1,957,925 | Williams | May 8, 1934 |
| 1,958,071 | Scofield | May 8, 1934 |
| 2,034,282 | Buckingham | Mar. 17, 1936 |
| 2,273,333 | Schluter | Feb. 17, 1942 |
| 2,469,951 | Cooley | May 10, 1949 |
| 2,628,343 | Murray | Feb. 10, 1953 |
| 2,753,173 | Barnaby et al. | July 3, 1956 |